(12) United States Patent
Burany et al.

(10) Patent No.: US 7,148,654 B2
(45) Date of Patent: Dec. 12, 2006

(54) METHOD AND APPARATUS FOR MONITORING FUEL CELL VOLTAGES

(75) Inventors: Stephen Burany, Thornhill (CA); Ravi B. Gopal, Oakville (CA); Norman A. Freeman, Richmond Hill (CA); Stéphane Massé, Toronto (CA)

(73) Assignee: Hydrogenics Corporation, Mississauga (CA)

( * ) Notice: Subject to any disclaimer, the term of this patent is extended or adjusted under 35 U.S.C. 154(b) by 344 days.

(21) Appl. No.: 10/725,567

(22) Filed: Dec. 3, 2003

(65) Prior Publication Data

US 2004/0150405 A1    Aug. 5, 2004

Related U.S. Application Data

(60) Provisional application No. 60/430,374, filed on Dec. 3, 2002.

(51) Int. Cl.
*H01M 10/44* (2006.01)
*H01M 10/46* (2006.01)

(52) U.S. Cl. .................................. 320/120
(58) Field of Classification Search ............... 320/101, 320/116, 117, 118, 120, 122, 132, 149; 324/427, 324/433
See application file for complete search history.

(56) References Cited

U.S. PATENT DOCUMENTS

| | | | |
|---|---|---|---|
| 3,676,770 A | 7/1972 | Sharaf et al. | |
| 3,753,094 A | 8/1973 | Furuishi et al. | |
| 4,071,819 A | 1/1978 | De Santis | |
| 4,316,185 A | 2/1982 | Watrous et al. | |
| 4,352,067 A | 9/1982 | Ottone | |
| 4,484,140 A | 11/1984 | Dieu | |
| 4,697,134 A | 9/1987 | Burkum et al. | |
| 4,743,855 A | 5/1988 | Randin et al. | |
| 4,972,181 A | 11/1990 | Fiene | |
| 5,047,722 A | 9/1991 | Wurst et al. | |
| 5,159,272 A | 10/1992 | Rao et al. | |
| 5,170,124 A | 12/1992 | Blair et al. | |
| 5,281,920 A | 1/1994 | Wurst | |
| 5,416,416 A | 5/1995 | Bisher | |
| 5,608,307 A | 3/1997 | Garrett et al. | |
| 5,670,861 A | 9/1997 | Nor | |
| 5,712,568 A | 1/1998 | Flohr et al. | |
| 5,763,113 A | 6/1998 | Meltser et al. | |
| 5,773,978 A | 6/1998 | Becker | |
| 5,914,606 A | 6/1999 | Becker-Irvin | |
| 5,923,148 A | 7/1999 | Sideris et al. | |
| 5,925,476 A | 7/1999 | Kawatsu | |
| 6,002,238 A | 12/1999 | Champlin | |
| 6,011,379 A | 1/2000 | Singh et al. | |
| 6,037,777 A | 3/2000 | Champlin | |
| 6,061,639 A * | 5/2000 | Wistrand | 324/427 |
| 6,140,820 A | 10/2000 | James | |
| 6,160,382 A | 12/2000 | Yoon et al. | |
| 6,239,579 B1 | 5/2001 | Dunn et al. | |
| 6,281,684 B1 | 8/2001 | James | |
| 6,285,164 B1 | 9/2001 | Noda et al. | |
| 6,297,618 B1 | 10/2001 | Emori et al. | |
| 6,307,350 B1 | 10/2001 | Alderman | |
| 6,313,750 B1 | 11/2001 | Lacy | |
| 6,335,611 B1 | 1/2002 | Sasaki | |
| 6,406,806 B1 | 6/2002 | Keskula et al. | |
| 6,410,176 B1 | 6/2002 | Genc et al. | |
| 6,423,434 B1 | 7/2002 | Pratt et al. | |
| 6,432,569 B1 | 8/2002 | Zeilinger et al. | |
| 6,455,180 B1 | 9/2002 | Mowery et al. | |
| 6,461,751 B1 | 10/2002 | Boehm et al. | |
| 6,472,880 B1 | 10/2002 | Kang | |
| 6,573,682 B1 | 6/2003 | Pearson | |
| 6,583,602 B1 * | 6/2003 | Imai et al. | 320/118 |
| 2002/0051899 A1 | 5/2002 | Keskula et al. | |
| 2002/0053896 A1 | 5/2002 | Adams et al. | |
| 2002/0090540 A1 | 7/2002 | Einhart et al. | |
| 2003/0076110 A1 | 4/2003 | Wang et al. | |
| 2003/0113594 A1 | 6/2003 | Pearson | |

FOREIGN PATENT DOCUMENTS

| | | |
|---|---|---|
| CA | 2334951 | 12/1999 |
| EP | 1 001 666 A2 | 5/2000 |
| EP | 1 088 241 B1 | 7/2002 |
| JP | 35921567 A | 12/1984 |
| JP | 60054176 | 3/1985 |
| JP | 01160367 2 A | 6/1989 |
| JP | 06243882 | 2/1993 |
| JP | 11260385 | 9/1999 |
| WO | WO 99/18448 | 4/1999 |
| WO | WO 99/66339 | 5/1999 |
| WO | 2000092732 | 3/2000 |
| WO | WO 00/31557 | 6/2000 |
| WO | WO 01/09631 A1 | 2/2001 |
| WO | WO 01/14898 A1 | 3/2001 |
| WO | WO 02/03086 A2 | 1/2002 |
| WO | WO 02/27342 A2 | 4/2002 |
| WO | WO 02/27832 A2 | 4/2002 |

* cited by examiner

*Primary Examiner*—Edward H. Tso
(74) *Attorney, Agent, or Firm*—Bereskin & Parr

(57) ABSTRACT

A system and method for monitoring cell voltages for a plurality of electrochemical cells connected in series forming a cell stack. The method includes dividing the cells into at least two cell groups, measuring the voltage across each cell group and estimating the minimum cell voltage for each group based on the average cell stack voltage and an estimated number of deficient cells in each group. The lowest minimum cell voltage for the entire cell stack is then determined.

28 Claims, 2 Drawing Sheets

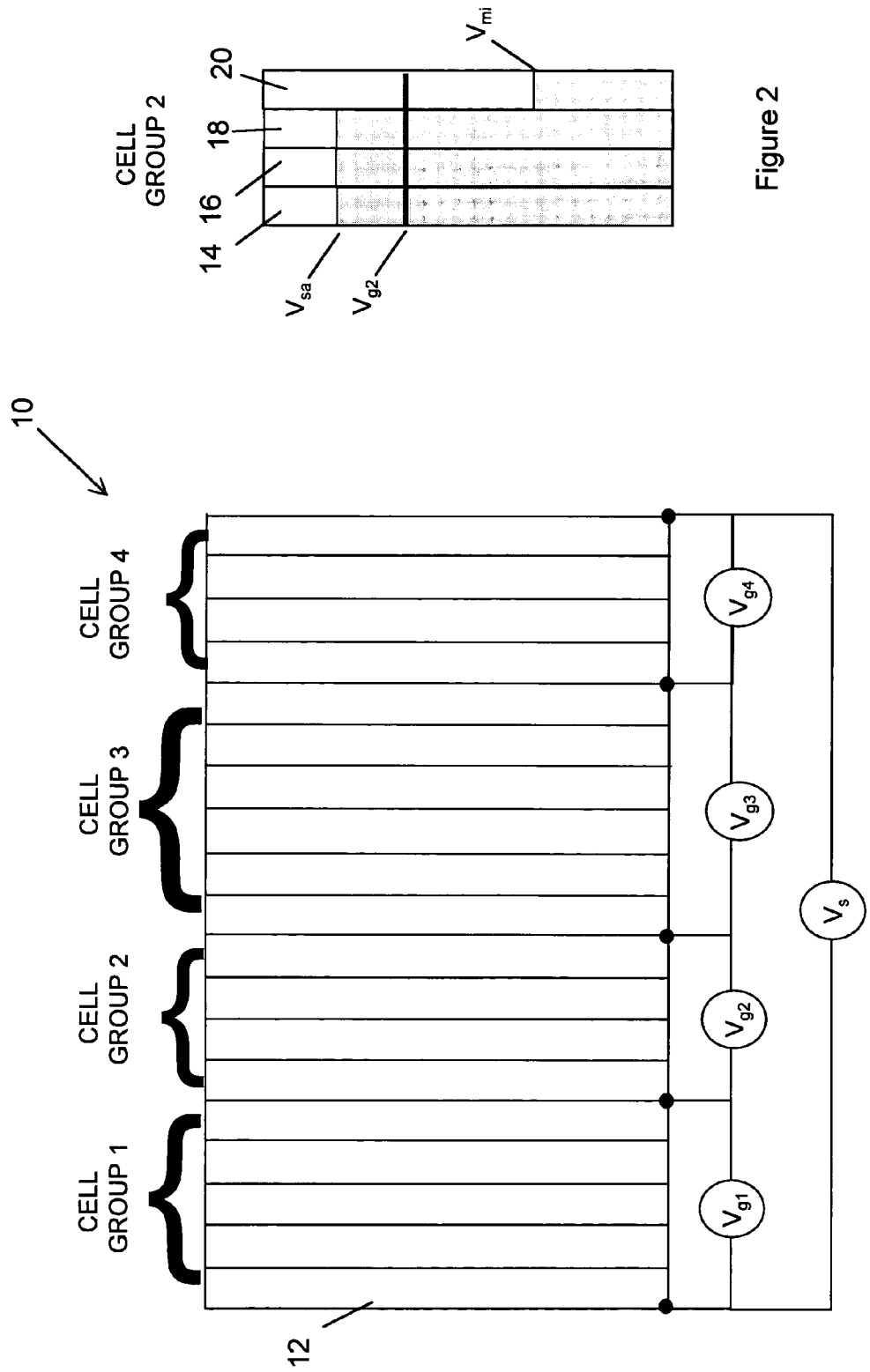

METHOD AND APPARATUS FOR MONITORING FUEL CELL VOLTAGES

CROSS REFERENCE

This application claims priority from U.S. Provisional Application Ser. No. 60/430,374 filed on Dec. 3, 2002.

FIELD OF THE INVENTION

The present invention relates to a voltage monitoring system and a method for measuring cell voltages. The invention has particular, but not exclusive, application to an electrochemical cell stack in which electrochemical cells are stacked in series.

BACKGROUND OF THE INVENTION

A fuel cell is an electrochemical device that produces an electromotive force by bringing the fuel (typically hydrogen) and an oxidant (typically air) into contact with two suitable electrodes and an electrolyte. A fuel, such as hydrogen gas, for example, is introduced at a first electrode where it reacts electrochemically in the presence of the electrolyte to produce electrons and cations in the first electrode. The electrons are circulated from the first electrode to a second electrode through an electrical circuit connected between the electrodes. Cations pass through the electrolyte to the second electrode. Simultaneously, an oxidant, such as oxygen or air is introduced to the second electrode where the oxidant reacts electrochemically in the presence of the electrolyte and a catalyst, producing anions and consuming the electrons circulated through the electrical circuit. The cations are consumed at the second electrode. The anions formed at the second electrode or cathode react with the cations to form a reaction product. The first electrode or anode may alternatively be referred to as a fuel or oxidizing electrode, and the second electrode may alternatively be referred to as an oxidant or reducing electrode. The half-cell reactions at the first and second electrodes respectively are:

$$H_2 \rightarrow 2H^+ + 2e^- \tag{1}$$

$$\tfrac{1}{2}O_2 + 2H^+ + 2e^- \rightarrow H_2O \tag{2}$$

An external electrical circuit withdraws electrical current and thus receives electrical power from the fuel cell. The overall fuel cell reaction produces electrical energy as shown by the sum of the separate half-cell reactions shown in equations 1 and 2. Water and heat are typical by-products of the reaction.

In practice, fuel cells are not operated as single units. Rather, fuel cells are connected in series, either stacked one on top of the other or placed side by side. The series of fuel cells, referred to as a fuel cell stack, is normally enclosed in a housing. The fuel and oxidant are directed through manifolds in the housing to the electrodes. The fuel cell is cooled by either the reactants or a cooling medium. The fuel cell stack also comprises current collectors, cell-to-cell seals and insulation while the required piping and instrumentation are provided external to the fuel cell stack. The fuel cell stack, housing and associated hardware constitute a fuel cell module.

Various parameters have to be monitored to ensure proper fuel cell stack operation and to prevent damage of any of the fuel cells. One of these parameters is the voltage across each fuel cell in the fuel cell stack hereinafter referred to as cell voltage. Ideally, differential voltage measurement is done at the two terminals (i.e. anode and cathode) of each fuel cell in the fuel cell stack. However, since fuel cells are connected in series, and typically in large number, measuring cell voltage for each cell is often prohibitively expensive and troublesome. A common compromise that is made in the art is measuring voltages across groups of cells within a fuel cell stack.

An example of this type of fuel cell voltage monitoring system is disclosed by Blair et al. in U.S. Pat. No. 5,170,124. In this patent, fuel cells within a fuel cell stack are divided into a plurality of groups and the voltage across each fuel cell group is measured. Then the measured voltage of each fuel cell group is normalized, i.e. averaged according to the number of fuel cells in the group. The normalized voltage of each fuel cell group is then compared with a reference voltage equal to a predetermined minimum voltage. If the normalized measured voltage is less than the reference voltage, an alarm can be activated. Another example of a fuel cell voltage monitoring system that utilizes averaged cell voltages is disclosed by Zeilinger et al in U.S. Pat. No. 6,432,569.

Although such fuel cell voltage monitoring systems alleviate the problems of measuring every cell voltage while meeting the requirement of monitoring cell performance, only average cell voltages are obtainable from these systems. In reality, it is more than likely that one or more cells in a fuel cell group has a voltage considerably lower than those of the others while the average cell voltage of that fuel cell group is still well above the predetermined minimum cell voltage. In this case, the fuel cell voltage monitoring system will not be able to detect the poor performance of the "bad cell" and activate an alarm and hence a corresponding recovery operation cannot be initiated in a timely manner. This will eventually lead to damage of the fuel cell stack and power shutdown.

SUMMARY OF THE INVENTION

In order to overcome the problems associated with current methods of measuring cell voltage, the present invention provides a cell voltage monitoring system and method that can estimate the minimum cell voltage within a cell stack. The estimated minimum cell voltage is used as an indication of cell performance rather than relying on measuring average cell voltage. The inventors have found that this measurement scheme provides a more accurate indication of cell performance with the added benefit of not having to measure each cell voltage in the cell stack. When the estimated minimum cell voltage drops below a certain value, a correction operation or shutdown can be performed for the cell stack.

In accordance with a first aspect, the present invention provides a method for monitoring cell voltages for a plurality of electrochemical cells connected in series forming a cell stack. The method comprises:

a) dividing the plurality of electrochemical cells into at least two cell groups;

b) determining an average cell stack voltage $V_{sa}$;

c) measuring a cell group voltage $V_g$ for each cell group;

d) estimating a minimum cell voltage $V_{mi}$ for each cell group to obtain a set of minimum cell voltages; and, e) determining a minimum cell voltage $V_{min}$ for the cell stack by finding the minimum value in the set of minimum cell voltages.

The minimum cell voltage for one of the cell groups is estimated according to $$V_{mi} = \frac{V_g}{M} - \frac{(N-M)*V_{ss}}{M}$$

where N is a number of cells in the cell group, and M is an estimated number of cells operating below the average cell stack voltage.

In accordance with a second aspect, the present invention provides a voltage monitoring system for monitoring cell voltages for a plurality of electrochemical cells connected in series forming a cell stack. The plurality of electrochemical cells are divided into at least two cell groups. The voltage monitoring system comprises a voltage measuring unit for measuring cell group voltage $V_g$ for each cell group, and cell stack voltage $V_s$ for the cell stack. The voltage monitoring system also comprises a processing means connected to the voltage measuring unit for calculating an average cell stack voltage $V_{sa}$, estimating a cell group minimum cell voltage $V_{mi}$ for each cell group to obtain a set of minimum cell voltages, and determining a minimum cell voltage $V_{min}$ for the cell stack by finding the minimum value in the set of minimum cell voltages.

The processing means estimates the minimum cell voltage for one of the cell groups according to $$V_{mi} = \frac{V_g}{M} - \frac{(N-M)*V_{ss}}{M}$$

where N is a number of cells in the cell group, and M is an estimated number of cells operating below the average cell stack voltage.

In accordance with another aspect, the present invention provides a method for monitoring cell voltages for a plurality of electrochemical cells connected in series forming a cell stack. The method comprises:

a) dividing the plurality of electrochemical cells into at least two cell groups;

b) determining an average cell stack voltage $V_{sa}$;

c) measuring a cell group voltage $V_g$ for one of the cell groups;

d) estimating a minimum cell voltage $V_{mi}$ for the one of the cell groups;

e) comparing the minimum cell voltage $V_{mi}$ to a threshold value; and, f) repeating steps c, d and e until one of the minimum cell voltages $V_{mi}$ is less than or equal to the threshold value or the minimum cell voltage for each of the cell groups has been estimated.

In accordance with another aspect, the present invention provides a voltage monitoring system for monitoring cell voltages for a plurality of electrochemical cells connected in series forming a cell stack, the plurality of electrochemical cells being divided into at least two cell groups. The voltage monitoring system comprises a voltage measuring unit for measuring a cell group voltage $V_g$ for each cell group, and a cell stack voltage $V_s$ for the cell stack. The voltage monitoring system further comprises a processing means connected to the voltage measuring unit for calculating an average cell stack voltage $V_{sa}$, repeatedly estimating a cell group minimum cell voltage $V_{mi}$ for one of the cell groups and comparing the minimum cell voltage $V_{mi}$ to a threshold value until one of the minimum cell voltages $V_{mi}$ is less than or equal to the threshold value or the minimum cell voltage $V_{mi}$ for each of the cell groups has been estimated.

BRIEF DESCRIPTION OF THE DRAWINGS

For a better understanding of the present invention and to show more clearly how it may be carried into effect, reference will now be made, by way of example, to the accompanying drawings which show a preferred embodiment of the present invention and in which:

FIG. 1 is a block diagram of an electrochemical cell stack divided into a plurality of cell groups;

FIG. 2 is a block diagram illustrating the cell voltages in one of the cell groups of FIG. 1; and, FIG. 3 is a block diagram of a fuel cell voltage monitoring system that estimates minimum cell voltage in accordance with the present invention.

DETAILED DESCRIPTION OF THE INVENTION

Figure 3:
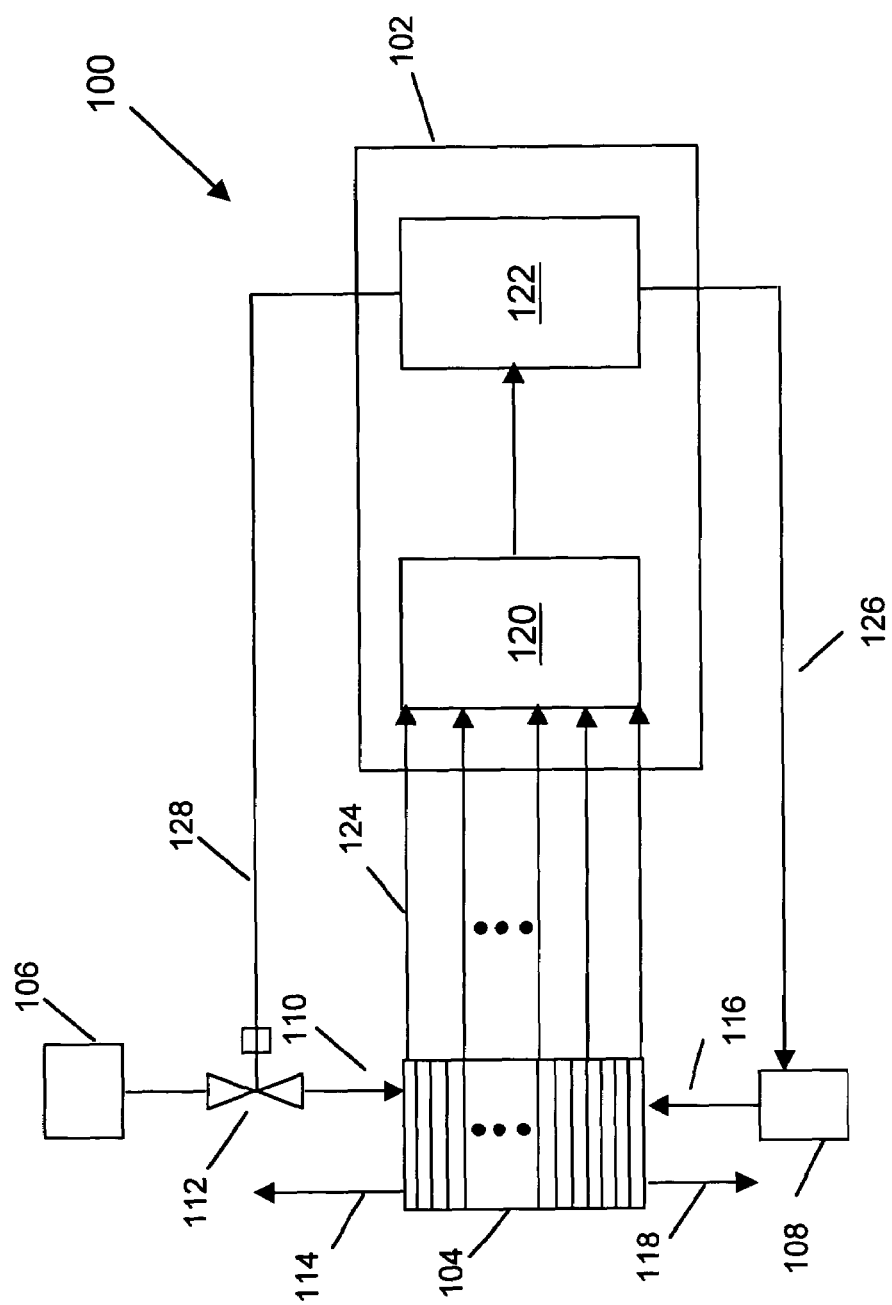

Referring first to FIG. 1, shown therein is an electrochemical cell stack 10, which may be a battery or a fuel cell stack, comprising a plurality of cells 12 stacked in series (only one of the cells is labeled for simplicity). Each cell 12 typically generates a voltage of about 0.6 to 1.0 volts. The plurality of cells 12 is divided into a plurality of cell groups. Each cell group can have the same number of cells. Alternatively, at least one of the cell groups does not have to have the same number of cells as the other cell groups. For example, as shown in FIG. 1, the electrochemical cell stack 10 comprises 20 cells divided into 4 cell groups in which cell group 1 consists of 5 cells, cell group 2 consists of 4 cells, cell group 3 consists of 6 cells and group cell 4 consists of 5 cells. In practice, the number of cell groups within the electrochemical cell stack 10 and the number of cells within each cell group can be selected according to actual system requirements.

Group cell voltages $V_{gi}$ are measured across the two ends of each cell group. A stack voltage $V_s$ is also measured across the whole electrochemical cell stack 10. The overall stack voltage $V_s$ is then divided by the total number of cells in the electrochemical cell stack 10 to obtain an average cell stack voltage $V_{sa}$.

Referring now to FIG. 2, shown therein is a block diagram illustrating exemplary cell voltages for cell group 2 of FIG. 1. It is estimated that within cell group 2, three of the cells, namely cells 14, 16 and 18 are operating at the average cell stack voltage $V_{sa}$ and one cell, namely cell 20 is operating below the average cell stack voltage $V_{sa}$, thereby decreasing the cell group voltage $V_{g2}$. In this case, the following equation can be can be used to obtain the cell group $V_{g2}$:

$$V_{g2} = V_{m2} + 3V_{sa} \quad (1)$$

where $V_{m2}$ is the minimum cell voltage in the fuel cell group. Accordingly, the minimum cell voltage $V_{m2}$ can be obtained from the following equation:

$$V_{m2} = V_{g2} - 3V_{sa} \quad (2)$$

In reality, there may be any number of cells operating below the average cell stack voltage $V_{sa}$ within a specific fuel cell group. In the present invention, it is assumed each cell operating below the average cell stack voltage operates at the same cell voltage $V_{mi}$. Therefore, in general, the cell voltage $V_{gi}$ for a cell group i can be obtained from the following equation:

$$V_{gi} = M * V_{mi} + (N-M) * V_{sa} \quad (3)$$

where N is the number of cells within the cell group i and M is the estimated number of cells operating below the average cell stack voltage $V_{sa}$. Accordingly, M has a value that is less than or equal to N. Therefore, in general, the minimum cell voltage for the cell group i can be estimated as follows:

$$V_{mi} = \frac{V_{gi}}{M} - \frac{(N-M) * V_{sa}}{M} \quad (4)$$

Equation 4 is used to estimate the minimum cell voltage $V_{mi}$ for a cell group i for any number of cells operating below the average cell stack voltage $V_{sa}$ in the cell group i by setting the parameter M equal to the estimated number of cells that are operating under the average cell stack voltage $V_{sa}$. This estimation is done for each and every cell group within the electrochemical cell stack to obtain a set of minimum cell voltages $V_{mi}$, from which the minimum value is selected as a minimum cell voltage $V_{min}$ for the entire electrochemical cell stack 10. In practice, voltage measurement for each cell group and the entire electrochemical cell stack 10 is performed at a certain interval, for example every 10 ms. The minimum cell voltage $V_{mi}$ is then estimated and used to determine whether or not the cells are operating at an acceptable condition. In general, the parameter M is a low value such as 1 whereas the number of cells N in a particular cell group is on the order of 4 to 6. However, as the number of cells N in the electrochemical cell stack 10 increases, the parameter M may be also be increased.

Referring now to FIG. 3, shown therein is an exemplary embodiment of a fuel cell system 100 that incorporates a fuel cell voltage monitoring system 102 in accordance with the present invention. The fuel cell system 100 comprises a fuel cell stack 104, a fuel storage vessel 106 and a compressor (or blower) 108. The fuel storage vessel 106 contains fuel that is supplied to the fuel cell stack 104 via a fuel supply line 110. The fuel supply line 110 includes a flow control valve 112 to regulate the amount of fuel that is supplied to the fuel cell stack 104. The fuel cell stack 104 is also connected to a fuel discharge line 114 to discharge fuel from the fuel cell stack 104. The compressor 108 supplies an oxidant, such as air, to the fuel cell stack 104 via an oxidant supply line 116. The fuel cell stack 104 is also connected to an oxidant discharge line 118 for discharging oxidant exhaust.

The fuel cell voltage monitoring system 102 comprises a voltage measuring unit 120 and a processing unit 122. The voltage measuring unit 120 is connected to the fuel cell stack 104 via a plurality of electrical lines or contacts 124 to measure the voltages across a plurality of cell groups within the fuel cell stack 104. The voltage measuring unit 120 provides the measured cell group voltages $V_{gi}$ as well as the stack voltage $V_s$ to the processing unit 122. The processing unit 122 then calculates the average cell stack voltage $V_{sa}$ and estimates the minimum cell voltage $V_{mi}$ for each cell group and the overall minimum cell voltage $V_{min}$ for the entire fuel cell stack 104 in accordance with the present invention. The voltage measuring unit 120 may comprise a bank of differential amplifiers, or the like, with appropriate pre-processing circuitry for effecting the voltage measurements, as is commonly known to those skilled in the art. The processing unit 122 may be a controller, or a microprocessor. There may be additional hardware components connected between the voltage measuring unit 120 and the processing unit 122 such as an analog-to-digital converter and a digital-to-analog converter.

The processing unit 122 uses the minimum cell voltage $V_{min}$ to control the operation of the fuel cell system 100. Once the processing unit 122 estimates the minimum cell voltage $V_{min}$ of the entire fuel cell stack 104, the processing unit 122 compares the minimum cell voltage $V_{min}$ to a first threshold value, such as 0.5 V for example. When the minimum cell voltage $V_{min}$ for the entire fuel cell stack 104 is equal to or less than the first threshold value, an alarm signal is activated. Preferably, the processing unit 122 controls components in the fuel cell system 100 to change the operating conditions in the fuel cell system 100 so that the cells that have a below average cell voltage can recover their cell voltages. For instance, in many cases, cell voltage drops because the cell is flooded with fuel. Accordingly, in this situation, the processing unit 122 controls the compressor 108 via a control line 126 to increase the speed of the compressor 108 to supply more oxidant to the fuel cell stack 104 and expel the accumulated water out of the flooded cell, thereby recovering cell voltage.

The processing unit 122 also compares the minimum cell voltage $V_{min}$ for the entire fuel cell stack 104 to a second threshold value such as 0.3 V. When the minimum cell voltage $V_{min}$ is equal to or less than the second threshold value, a shutdown signal is activated. The fuel cell system 100 can be shut down manually. However, and more preferably, the processing unit 122 can immediately shut down the fuel cell system 100 by shutting down the compressor 108 to stop the flow of oxidant and by closing the flow control valve 112, by sending a control signal via control line 128, to stop the supply of fuel.

It should be understood that FIG. 3 shows an exemplary embodiment of a fuel cell system and that an actual fuel cell system may have different or additional components. Furthermore, it should be understood that the voltage measuring unit 120 and the processing unit 122 repeatedly perform the voltage monitoring method of the present invention, and the comparisons with the threshold levels, during the operation of the fuel cell system 100.

In an alternative, the minimum cell voltage $V_{mi}$ for each cell group does not need to be estimated for each cell group if any of the estimated minimum cell voltages $V_{mi}$ that are thus far estimated are smaller than the first or second thresholds. For instance, if there are 5 cell groups, and if after estimating the minimum cell voltages for the first two cell groups it is determined that one of the minimum cell voltages $V_{mi}$ is smaller than the first or second threshold, then there is no need to estimate the remaining minimum cell voltages. A suitable action can be done based on this result. In the example of FIG. 3, the processing unit 122 can perform the suitable action of shutting down the fuel cell system 100 or increasing the setting on the compressor 108 to provide more oxidant, as the particular situation dictates.

The present invention allows for adequate estimation of the minimum cell voltage within an electrochemical cell stack while avoiding the need to measure the voltage of every cell. It should be understood that the present invention is intended not only for monitoring the voltages of fuel cell stacks, but also for monitoring the voltages in any kind of multi-cell battery formed by connecting individual cells in series such as a battery bank or an electrolyser.

It should be further understood that various modifications can be made, by those skilled in the art, to the preferred embodiments described and illustrated herein, without departing from the present invention, the scope of which is defined in the appended claims.

The invention claimed is:

1. A method for monitoring cell voltages for a plurality of electrochemical cells connected in series forming a cell stack, the method comprising:
   a) dividing the plurality of electrochemical cells into at least two cell groups;
   b) determining an average cell stack voltage $V_{sa}$;
   c) measuring a cell group voltage $V_g$ for each cell group;
   d) estimating a minimum cell voltage $V_{mi}$ for each cell group to obtain a set of minimum cell voltages, the minimum cell voltage for a given cell group being estimated according to $$V_{mi} = \frac{V_g}{M} - \frac{(N-M)*V_{ss}}{M}$$

where N is a number of cells in the cell group, and M is an estimated number of cells operation below the average cell stack voltage; and,
   e) determining a minimum cell voltage $V_{min}$ for the cell stack by finding the minimum value in the set of minimum cell voltages $V_{mi}$.

2. A method as claimed in claim 1, wherein the method further comprises:
   f) activating an alarm when the minimum cell voltage $V_{min}$ for the cell stack is equal to or less than a first threshold value.

3. A method as claimed in claim 1, wherein the method further comprises:
   f) shutting down the cell stack when the minimum cell voltage $V_{min}$ for the cell stack is equal to or less than a second threshold value.

4. A method as claimed in claim 1, wherein the number of cells N in the cell group is 4.

5. A method as claimed in claim 1, wherein the estimated number of cells M operating below the average cell stack voltage is 1.

6. A method as claimed in claim 2, wherein the first threshold value is 0.5 V.

7. A method as claimed in claim 3, wherein the second threshold value is 0.3 V.

8. A voltage monitoring system for monitoring cell voltages for a plurality of electrochemical cells connected in series forming a cell stack, the plurality of electrochemical cells being divided into at least two cell groups, the voltage monitoring system comprising:
   a) a voltage measuring unit for measuring a cell group voltage $V_g$ for each cell group, and a cell stack voltage $V_{sa}$ for the cell stack; and,
   b) a processing means connected to the voltage measuring unit for calculating an average cell stack voltage $V_{sa}$, estimating a cell group minimum cell voltage $V_{mi}$ for each cell group to obtain a set of minimum cell voltages, and determining a minimum cell voltage $V_{min}$ for the cell stack by finding the minimum value in the set of minimum cell voltages wherein the processing means estimates the minimum cell voltage for a given cell group according to $$V_{mi} = \frac{V_g}{M} - \frac{(N-M)*V_{ss}}{M}$$

where N is a number of cells in the cell group, and M is an estimated number of cells operating below the average cell stack voltage.

9. A voltage monitoring system as claimed in claim 8, wherein the processing means activates an alarm when the minimum cell voltage $V_{min}$ for the cell stack is equal to or less than a first threshold value.

10. A voltage monitoring system as claimed in claim 8, wherein the processing means shuts down the cell stack when the minimum cell voltage $V_{min}$ for the cell stack is equal to or less than a second threshold value.

11. A voltage monitoring system as claimed in claim 8, wherein the number of cells N in the cell group is 4.

12. A voltage monitoring system as claimed in claim 8, wherein the estimated number of cells M operating below the average cell stack voltage is 1.

13. A voltage monitoring system as claimed in claim 9, wherein the first threshold value is 0.5 V.

14. A voltage monitoring system as claimed in claim 10, wherein the second threshold value is 0.3 V.

15. A method for monitoring cell voltages for a plurality of electrochemical cells connected in series forming a cell stack, the method comprising:
   a) dividing the plurality of electrochemical cells into at least two cell groups;
   b) determining an average cell stack voltage $V_{sa}$;
   c) measuring a cell group voltage $V_g$ for one of the cell groups;
   d) estimating a minimum cell voltage $V_{mi}$ for the one of the cell groups according to $$V_{mi} = \frac{V_g}{M} - \frac{(N-M)*V_{ss}}{M}$$

where N is a number of cells in the cell group, and M is an estimated number of cells operation below the average cell stack voltage;
   e) comparing the minimum cell voltage $V_{mi}$ to a threshold value; and,
   f) repeating steps c, d and e until one of the minimum cell voltages $V_{mi}$ is less than or equal to the threshold value or the minimum cell voltage for each of the cell groups has been estimated.

16. A method as claimed in claim 15, wherein the method further comprises:
   g) activating an alarm when the minimum cell voltage $V_{min}$ for the cell stack is equal to or less than the threshold value.

17. A method as claimed in claim 15, wherein the method further comprises:
   g) shutting down the cell stack when the minimum cell voltage $V_{min}$ for the cell stack is equal to or less than the threshold value.

18. A method as claimed in claim 15, wherein the number of cells N in the cell group is 4.

19. A method as claimed in claim 15, wherein the estimated number of cells M operating below the average cell stack voltage is 1.

20. A method as claimed in claim 16, wherein the threshold value is 0.5 V.

21. A method as claimed in claim 17, wherein the threshold value is 0.3 V.

22. A voltage monitoring system for monitoring cell voltages for a plurality of electrochemical cells connected in series forming a cell stack, the plurality of electrochemical cells being divided into at least two cell groups, the voltage monitoring system comprising:
   a) a voltage measuring unit for measuring a cell group voltage $V_g$ for each cell group, and a cell stack voltage $V_s$ for the cell stack; and,
   b) a processing means connected to the voltage measuring unit for calculating an average cell stack voltage $V_{sa}$, repeatedly estimating a cell group minimum cell voltage $V_{mi}$ for one of the cell groups and comparing the minimum cell voltage $V_{mi}$ to a threshold value until one of the minimum cell voltages $V_{mi}$ is less than or equal to the threshold value or the minimum cell voltage $V_{mi}$ for each of the cell groups has been estimated wherein the processing means estimates the minimum cell voltage for the one of the cell groups according to $$V_{mi} = \frac{V_g}{M} - \frac{(N-M)*V_{ss}}{M}$$

where N is a number of cells in the one of the cell groups, and M is an estimated number of cells operation below the average cell stack voltage.

23. A voltage monitoring system as claimed in claim 22, wherein the processing means activates an alarm when the minimum cell voltage $V_{min}$ for the cell stack is equal to or less than the threshold value.

24. A voltage monitoring system as claimed in claim 22, wherein the processing means shuts down the cell stack when the minimum cell voltage $V_{min}$ for the cell stack is equal to or less than the threshold value.

25. A voltage monitoring system as claimed in claim 22, wherein the number of cells N in the cell group is 4.

26. A voltage monitoring system as claimed in claim 22, wherein the estimated number of cells M operating below the average cell stack voltage is 1.

27. A voltage monitoring system as claimed in claim 23, wherein the threshold value is 0.5 V.

28. A voltage monitoring system as claimed in claim 24, wherein the threshold value is 0.3 V.

* * * * *

UNITED STATES PATENT AND TRADEMARK OFFICE
CERTIFICATE OF CORRECTION

PATENT NO.       : 7,148,654 B2
APPLICATION NO.  : 10/725567
DATED            : December 12, 2006
INVENTOR(S)      : Stephen Burany et al.

It is certified that error appears in the above-identified patent and that said Letters Patent is hereby corrected as shown below:

In the Summary Of The Invention, column 3, line 1, the equation

" $V_{mi} = \frac{V_g}{M} - \frac{(N-M)*V_{ss}}{M}$ " has been changed to -- $V_{mi} = \frac{V_g}{M} - \frac{(N-M)*V_{sa}}{M}$ --.

In the Summary Of The Invention, column 3, line 27, the equation

" $V_{mi} = \frac{V_g}{M} - \frac{(N-M)*V_{ss}}{M}$ " has been changed to -- $V_{mi} = \frac{V_g}{M} - \frac{(N-M)*V_{sa}}{M}$ --.

In the Claims, column 7, line 18, claim 1, the equation

" $V_{mi} = \frac{V_g}{M} - \frac{(N-M)*V_{ss}}{M}$ " has been changed to -- $V_{mi} = \frac{V_g}{M} - \frac{(N-M)*V_{sa}}{M}$ --.

In the Claims, column 7, line 25, claim 1, the word "operation" has been changed to --operating--, so that the line reads --estimated number of cells operating below the average cell--.

In the Claims, column 8, line 1, claim 8, the equation " $V_{mi} = \frac{V_g}{M} - \frac{(N-M)*V_{ss}}{M}$ " has been changed to -- $V_{mi} = \frac{V_g}{M} - \frac{(N-M)*V_{sa}}{M}$ --.

In the Claims, column 8, line 36, claim 15, the equation " $V_{mi} = \frac{V_g}{M} - \frac{(N-M)*V_{ss}}{M}$ " has been changed to -- $V_{mi} = \frac{V_g}{M} - \frac{(N-M)*V_{sa}}{M}$ --.

In the Claims, column 8, line 43, claim 15, the word "operation" has been changed to --operating--, so that the line reads --estimated number of cells operating below the average cell--.

UNITED STATES PATENT AND TRADEMARK OFFICE
CERTIFICATE OF CORRECTION

PATENT NO. : 7,148,654 B2
APPLICATION NO. : 10/725567
DATED : December 12, 2006
INVENTOR(S) : Stephen Burany et al.

It is certified that error appears in the above-identified patent and that said Letters Patent is hereby corrected as shown below:

In the Claims, column 9, line 21, claim 22, the equation "$V_{mi} = \frac{V_g}{M} - \frac{(N-M)*V_{ss}}{M}$" has been changed to --$V_{mi} = \frac{V_g}{M} - \frac{(N-M)*V_{sa}}{M}$--.

Signed and Sealed this

Twenty-second Day of May, 2007

JON W. DUDAS
*Director of the United States Patent and Trademark Office*